United States Patent
Coehoorn et al.

(10) Patent No.: US 6,577,124 B2
(45) Date of Patent: *Jun. 10, 2003

(54) MAGNETIC FIELD SENSOR WITH PERPENDICULAR AXIS SENSITIVITY, COMPRISING A GIANT MAGNETORESISTANCE MATERIAL OR A SPIN TUNNEL JUNCTION

(75) Inventors: Reinder Coehoorn, Eindhoven (NL); Kars-Michiel H. Lenssen, Eindhoven (NL); Pascal J. H. Bloemen, Eindhoven (NL)

(73) Assignee: Koninklijke Philips Electronics N.V., Eindhoven (NL)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/373,430

(22) Filed: Aug. 13, 1999

(65) Prior Publication Data

US 2001/0013776 A1 Aug. 16, 2001

(30) Foreign Application Priority Data

Aug. 14, 1998 (EP) .............................................. 98202728

(51) Int. Cl.⁷ .............................................. G01R 33/02
(52) U.S. Cl. ..................... 324/252; 338/32 R
(58) Field of Search ................................. 324/252, 249; 338/32 R; 360/327.3, 324, 324.2, 313, 326, 314; 428/900

(56) References Cited

U.S. PATENT DOCUMENTS

| | | | | |
|---|---|---|---|---|
| 4,048,557 A | * | 9/1977 | Chen ........................... | 324/210 |
| 4,686,535 A | * | 8/1987 | Lalezari ............... | 343/700 MS |
| 5,561,368 A | * | 10/1996 | Dovek et al. ................ | 324/252 |
| 5,629,922 A | * | 5/1997 | Moodera et al. ............ | 369/126 |
| 5,686,837 A | * | 11/1997 | Coehoorn et al. ........... | 324/252 |
| 5,712,612 A | * | 1/1998 | Lee et al. .................. | 338/32 R |
| 5,738,938 A | * | 4/1998 | Kawano et al. ............. | 428/332 |
| 5,856,897 A | * | 1/1999 | Mauri ........................ | 360/113 |

* cited by examiner

Primary Examiner—Jay Patidar
(74) Attorney, Agent, or Firm—Aaron Waxler

(57) ABSTRACT

A thin film magnetic field sensor with perpendicular axis sensitivity uses either a giant magnetoresistance material element or a spin tunnel junction element. The sensor element has ferromagnetic layers which have strongly different uniaxial anisotropies and/or a modified magnetization curve, achieved by antiferromagnetic exchange coupling with an auxiliary ferromagnetic layer. A strongly miniaturizable sensor has four spin tunnel junction elements connected to form a Wheatstone bridge. The magnetically sensitive element functions equally as well as a laminated flux concentrator, resulting in a low noise single domain configuration. The very simple design also allows easy definition of the fixed magnetization direction of a counter electrode. Very high output voltage combined with very low power is achieved.

3 Claims, 2 Drawing Sheets

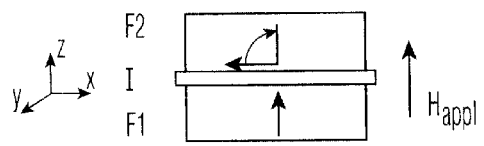 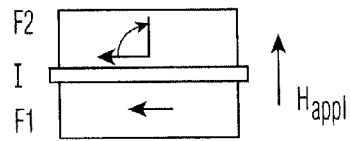
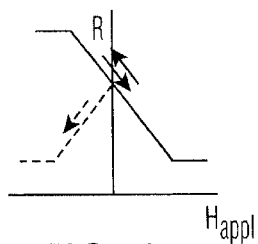 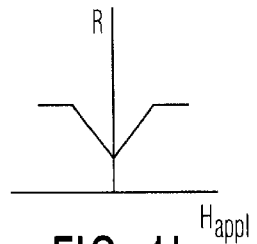
FIG. 1a  FIG. 1b
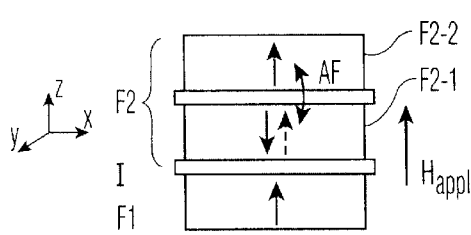 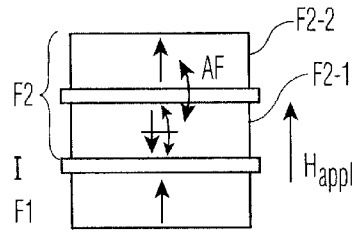
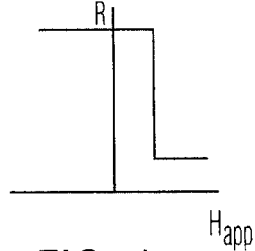 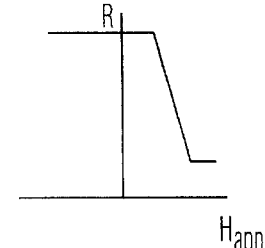
FIG. 1c  FIG. 1d
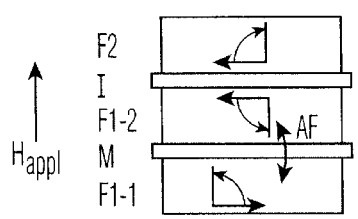 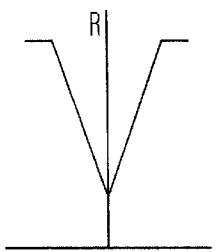
FIG. 1e

MAGNETIC FIELD SENSOR WITH PERPENDICULAR AXIS SENSITIVITY, COMPRISING A GIANT MAGNETORESISTANCE MATERIAL OR A SPIN TUNNEL JUNCTION

BACKGROUND OF THE INVENTION

Magnetic field sensors based on semiconductor thin films, either employing the Hall effect or their (ordinary) magnetoresistance are sensitive to magnetic fields that are directed perpendicular to the plane of the film. For a range of applications, such as brushless permanent magnet electromotors, crank shaft and cam shaft position sensors and ABS (acceleration-decelaration) sensors in automotive systems, this is often the preferred orientation in view of spatial limitations (miniaturization). The sensistivity of the known devices is, however, limited, and there is an ever increasing need for higher sensitivity.

SUMMARY OF THE INVENTION

An object of the present invention is to realize semiconductor thin film magnetic field sensors for measuring a component of a magnetic field perpendicular to the plane of the film with useful, and therefore increased, sensitivity.

To this end the magnetic field sensor according to the invention comprises a giant magnetoresistance (GMR) material or a spin tunnel junction. In the sensor in accordance with the invention the perpendicular sensitivity, i.e. sensitivity for a component of the applied magnetic field perpendicular to the plane of the film, is based on the GMR effect and/or spin tunnel junctions. Sensors based on the giant magnetoresistance (GMR) or the spin tunneling effect (also called tunnel magnetoresistance (TMR)) over.a strongly improved sensitivity in particular to the component of magnetic field perpendicular to the films. However, all designs proposed so far show useful sensitivity for a magnetic field in the plane of the films only. The invention makes it possible to provide GMR and spin tunneling based sensors (with useful perpendicular-field, as well as in-plane, sensitivities), all based on the same physical principles, with the advantage of the high sensitivity offered by these technologies.

A spin tunnel junction (STJ) comprise a layered structure F1/I/F2, where F1 and F2 are layers which may be laminated, but which at least contain one ferromagnetic layer, and where I is an insulating barrier layer. The tunnel current is directed perpendicular to the plane of the layers. The GMR layered structures that we consider here comprise a similar layered structure F1/M/F2, where F1 and F2 are layers which may be laminated, but which contain at least one ferromagnetic layer, and where M is a non-ferromagnetic (often: non-magnetic) separation layer. In principle either the Current In the Plane of the layers (CIP) geometry or the Current Perpendicular to the Plane (CPP) geometry can be used. However, in practice the much larger resistance change combined with the more simple manufacturing process will favour the use of the CIP geometry in sensors.

Sensitivity to a perpendicularly directed magnetic field (more generally: to the perpendicular component of an applied magnetic field) is particularly high in sensors having F1 and F2 layers with a strongly different uniaxial anisotropy, and/or with a modified magnetization curve. A modified curve can be realized by antiferromagnetic coupling with an auxiliary ferromagnetic layer. More specifically it is advantageous to select the field range within which the element is sensitive by making use of uniaxial interface anisotropy, either easy-plane or easy-axis, and/or to realize step-shaped resistance field (R(H)) curves by making use of antiferromagnetic interlayer exchange coupling, and/or to strongly increase the sensitivity of the sensors by providing an auxiliary ferromagnetic layer. Antiferromagnetic interlayer exchange coupling increases the sensitivity.

The various ways used to optimize the magnetization curves of the layers that determine the electrical resistance are sometimes referred to in the literature as 'spin engineering'. The sensor designs according to the invention are preferably based on spin tunnel junctions, because for such systems only the magnetization direction of the magnetic layer closest to the oxide barrier layer determines the magnetoresistance (as far as is known at the present). The use of auxiliary magnetic layers situated away from that interface does not affect the electrical resistance. Nevertheless, with suitably chosen auxiliary layers (high resistivity) the same ideas can also be applied to GMR systems. Although the text below is focused on the application to spin tunnel junctions, the same solution applies for sensors based on GMR effects.

BRIEF DESCRIPTION OF THE DRAWINGS

These and other aspects of the invention will be apparent from and elucidated with reference to the embodiments described hereafter. In the drawings:

FIGS 1a–1d show four embodiments of the sensor structure in accordance with the invention, as described in the text, with the corresponding R(H) (resistance R as function of applied field $H_{appl}$ perpendicular to the plane of the film) curves. The full arrows denote the magnetization direction in the quiescent state.

FIG. 1e shows a fifth embodiment of the sensor structure in accordance with the invention, as described in the text, with the corresponding R(H) (resistance R as function of applied field $H_{appl}$) curves. The full arrows denote the magnetization direction in the quiescent state.

DESCRIPTION OF THE PREFERRED EMBODIMENTS

Figure 2A:
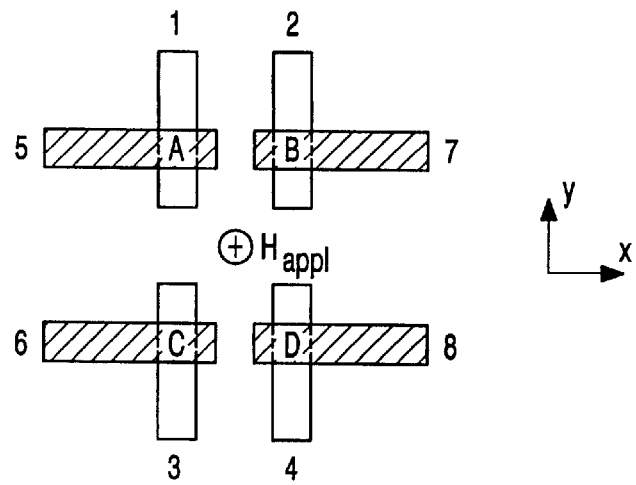
FIG. 2a shows the general form of a Wheatstone bridge containing spin tunnel elements in accordance with the invention

In all FIGS. 1a to 1e the plane of the film is indicated by the x-y plane, the z-direction being perpendicular to this plane. The applied field $H_{appl}$ is indicated by the arrow $H_{appl}$ in the z-direction.

In structure (a) (FIG. 1a) the magnetization of layer F1, or at least of the part of layer F1 that is closest to the insulating layer I, is directed perpendicular to the film plane by strong perpendicular anisotropy as indicated by the full arrow in layer F1. This may be realized in practice by making use of a laminated structure, for example, a Co/Pd multilayer. The magnetization of layer F2 rotates from in-plane to perpendicular to the plane (z-direction) under the influence of an applied magnetic field $H_{appl}$ in the z-direction. The magnetization rotation is indicated by the arrows in layer F2. This layer F2 has in-plane anisotropy, but if necessary with an effective anisotropy field that is (much) smaller than the coercivity by making use of a laminated structure within which the interfaces contribute a perpendicular anisotropy component. Again, a possible practical material for realizing this is a Co/Pd multilayer. By varying the magnetic and nonmagnetic layer thicknesses the anisotropy field can be chosen. The lower part of the figure shows, schematically, the R($H_{appl}$), where R denotes the resistance and $H_{appl}$ the applied field perpendicular to the plane of the film, i.e. in the z-direction. With increasing $H_{appl}$ the resistance R decreases, until at the saturation field (anisotropy field of layer F2) the magnetization directions of both layers are parallel. The full curve applies if the coercivity of the F1 layer is sufficiently high. For zero coercivity, the dashed curve applies and for finite coercivity and a square hysteresis loop the resistance jumps at the coercive field from the full curve to the dashed curve (not shown in figure)

In structure (b) (FIG. 1b) the magnetization of layer F1, or at least of the part of layer F1 that is closest to the insulating layer I, is directed in the film plane as indicated by the arrow in layer F1. This may be realized by making use of a material with a high coercivity as a result of its high saturation magnetization (e.g $Fe_{65}Co_{35}$), and the effect may be enhanced if required by making use of negative (in-plane) interfacial anisotropy (e.g. using $Fe_{65}Co_{35}$/Ni/Mo). The composition and properties of the F2 layer are as structure (a). The lower part of the FIG. 1b shows the resulting R(H) curve. In practice it may be important to stabilize a single domain configuration in both layers and rotation of the magnetization of the F2 layer in a single plane by the application of a small in plane magnetic field, e.g. from a thin film permanent magnet film.

In structure (c) FIG. 1e) layer F1 is as in structure (a): it has its magnetization perpendicular to the film plane. The F2 layer consists of two ferromagnetic layers F2-1 and F2-2, separated by a metallic spacer layer that couples the two layer,s antiferromagnetically. Layers F2-1 and F2-2 both have strong, perpendicular anisotropy, which can be realized by lamination. At fields H>0 the magnetization of layer F2-2 is essentially perpendicular to the film plane in the up-direction. This may be realized by the application of a sufficiently large upward directed field for systems in which the magnetic moment per unit area of layer F2-2 is larger than that of layer F2-1, and/or for systems in which layer F2-2 has a larger coercivity than layer F2-1. The exchange coupling between F2-1 and F2-2 is described by the coupling field, Hcouple. The composition of layer F2-1 and the fabrication method are chosen such that its coercivity is very small. The R(H) curve is given in the lower part of the FIG. 1c. Layer F2-1 flips at H=Hcouple from the down to the up direction. Structure (d) (FIG. 1d) is similar to structure (c), the difference being the anisotropy of the F2-1 layer which is only weakly perpendicular or even in-plane, resulting in a more gradual rotation of layer F2-1 around H=Hcouple ('spin flop' instead of 'spin flip'), and a more linear response to field changes around the coupling field.

In structures (a–d) the F1 layer is magnetically inactive. For structures (a) and (b) this results in a sensor output for fields H>0 that is at most half of the possible maximum output. The full effect can be obtained by laminating F1, forming a antiferromagnetically coupled pair of layers, F1-1 and F1-2 (see FIG. 1(e)). In contrast to the situation in structures (c) and (d) the antiferromagnetic coupling is now very strong, leading to a coupling field that is much larger than the fields that have to be sensed. As a result, the two layers will remain anti-parallel under all practical conditions. The pair of layers has a weak effective uniaxial in-plane anisotropy, and a very low coercivity. A crucial point is that magnetization per unit area is largest for the F1-1 layer. As a result, the magnetization of the F1-2 layer, that is closest to the I layer, will rotate in the downward direction upon the application of an upward directed field. In combination with the upward rotation of layer F2, this leads to the required enhanced output, the output is doubled without a decrease of the dynamic range if the effective anisotropy fields of the F1 and F2 layers are equal.

All five types, but in particular type (c) and (d), are useful if a constant bias field is present. This is the case in sensors for automotive applications in which a permanent magnet for magnetizing a toothed wheel is mounted close to the sensor. The rotation of the toothed wheel results in a varying (but always positive) perpendicular component of the magnetic field perpendicular to the plane of the films at the position of the sensor. As a result of the positive bias field the required upward magnetization of the layers F1 and F2-2 in sensors of types (c) and (d) is stabilized.

Figure 2B:
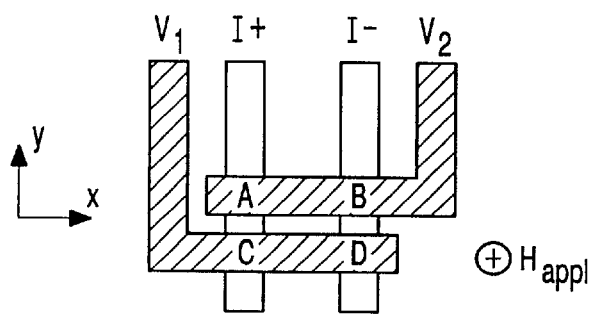
FIG. 2b shows a simplified bridge layout (see text) and FIG. 2c shows a Wheatstone bridge containing GMR elements.
Figure 2C:
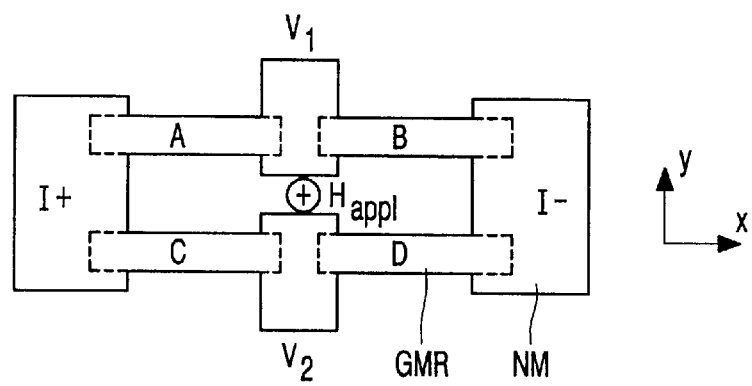

Various sensor structures are shown in FIGS. 2a to 2c. Although a single element and a half-Wheatstone bridge are within the scope of the invention,the most versatile embodiment of the invention is likely to be a sensor structure in the form of a Wheatstone bridge. Hereinbelow the embodiment of a sensor based on spin tunneling junctions is described. In its most general form, a Wheatstone bridge containing the elements described may have the form given in FIG. 2a. The structure functions as a Wheatstone bridge if the leads 1–2, 3–5, 4–7 and 6–8 are pairwise connected, and if current contacts are made at leads 1–2 and 6–8, and voltage contacts at leads 3–5 and 4–7, or vice versa. In each element the current direction is identical with respect to the different F1 and F2 layers. This is important at high voltages, where the I–V curves are non-symmetrical around zero. It is possible to circumvent this complication by driving the bridge in an ac-mode, or by restricting operation to low voltages. The bridge topology and connection pattern can then be simplified to the structure, shown in FIG. 2b. Also trimming structures for more perfectly balancing the bridge are within the scope of the invention.

The optimal form of the four bridge elements A–D will be determined in part by micromagnetic aspects. The dimension of each element may be as small as 50×50 $\mu$m if in situ shadow masks are used during deposition, or even smaller if ex situ patterning is used, making the total wafer surface area per element potentially very small. Unlike AMR or GMR elements, the output at given current density of spin tunnel elements is not determined by lateral dimensions. A Wheatstone bridge for operation at a positive bias field can be made by combining elements of structures (a) and (b) (the F2 layer deposited first, the F1 layers are different for opposite bridge elements). A Wheatstone bridge that operates around zero bias field can be made using elements of type (a), in which the F1 layers have sufficient coercivity and are magnetized pairwise antiparallel. "Programming" of such a bridge is possible by the local application of a high external magnetic field (like in perpendicular magnetic recording). The F1 layers in a Wheatstone bridge that makes use of structures (c) or (d) should be "Programmed" in a similar way, if it turns out that in practice the differences between the switching fields of each of the four elements are larger than can be tolerated, three of the four elements should be made insensitive by modifying the structure of layer F2 (of course, at the expense of a factor of 4 in the output voltage).

In principle, ring shaped current leads, integrated in the substrate underneath the element, could be used for the local application of programming or biasing magnetic fields. However, the practical realisability is not yet clear, and has to be studied in more detail. The currents required for these functions would probably be quite high. For GMR materials the current is strictly independent of the polarity of the applied voltage. The bridge layout can be as shown FIG. 2(c). If required, the single stripe shaped elements can be replaced by meandering patterns. In contrast to the case of GMR sensors with in-plane sensitivity, the in-plane demagnetizing field plays no role in the present case. Hence, patterning the elements in the form of very narrow non-meandering stripes, in order to enhance the output, is a possible alternative for enhancing the output whereas still keeping the total sensor area small.

Using GMR layered structures of the type F1/M/F2, where F1 and F2 are ferromagnetic layers and where M is a non-ferromagnetic separation layer, and/or using TMR layered structures of the type F1/I/F2, where F1 and F2 are ferromagnetic electrode layers, and where I is a high resistance (almost insulating) barrier layer, it is possible to realise GMR or TMR magnetic field sensors with perpendicular axis sensitivity by making use of F1 and F2 layers which have a strongly different magnetic response to an axial magnetic field.

For sensors that are used for measuring the precise value of the axial field additional requirements are linearity and reversibility of the response. The following layer structures (1)–(2) fulfill these requirements. They have in common that layer F2 has easy-plane anisotropy, and that the magnetization of layer F2 rotates from the in-plane to the axial direction under the influence of the axial field.

(1) The magnetization of the F1 layer is directed perpendicular to the film plane (see FIGS. 1a, 1c, 1d) by very strong perpendicular anisotropy. This can be realized by making use of a laminated structure, such as a Co/Pd multilayer.

(2) The magnetization of the F1 layer is essentially confined to the film plane (FIG. 1b), either as a result of the coercive field alone, or as a result of an enhanced effect due to lamination of this layer, making use of negative (in-plane) interface anisotropy. It consists e.g. of $Fe_{65}Co_{35}$, or of e.g. a stack of $Fe_{65}Co_{35}$/Ni/Mo. For both structures a small in-plane magnetic field, produced for example from a permanent magnet film, may be used to stabilize a certain specific in-plane magnetization direction. For structure (1) the resistance change depends on the sign and the magnitude of the field, for structures (2) it only depends on the magnitude.

For sensors that are used for sensing whether a field is above or below a certain value the following structure can be used:

(3) The structure of layer F1 is as in structure (1): it has its magnetization perpendicular to the film plane. The F2 layer consists of two ferromagnetic layers F2-1 and F2-2, separated by a metallic layer that couples the two layers antiferromagnetically (FIGS. 1c, 1d). Both layers have strong perpendicular anisotropy, if required realized by lamination (making use of interface anisotropy). Due to its strong anisotropy, the magnetization of the F2-2 layer, most far from the M (for GMR) or I (for TMR) layer, is always directed parallel to that of the F1 layer. At the so-called coupling field, or in a certain field interval around the coupling field (determined by the coupling, between the F2-1 and F2-2 layers), the magnetization of the F2-1 layer switches, and becomes parallel to that of the F1 and F2-2 layers, leading to a decrease of the resistance. For GMR structures the current is preferably parallel to the plane of the layers. For TMR structures the current is perpendicular to the plane of the layers.

What is claimed is:

1. A sensor based on a magnetoresistance effect, said sensor having at least three successive substantially planar layers and being arranged for measuring a magnetic field component which is perpendicular to said layers; said sensor comprising a first (F1) and a second (F2) ferromagnetic layer and an intermediate non-ferromagnetic layer, and producing a magnetoresistance characteristic which is substantially sensitive to a magnetic field component which is perpendicular to said layers, characterized in that the F2 layer is arranged such that:

in the absence of a substantial external magnetic field, the F2 layer has a magnetic anisotropy in the plane of the layers, and under the influence of an external magnetic field having a component perpendicular to the plane of the layers, the F2 layer has magnetization directed substantially perpendicularly to the plane of the layers, characterized in that the F2 layer is a multilayer structure comprising at least one sublayer of magnetic material and at least one sublayer of metal, the sublayers having mutual interfaces that produce a perpendicular anisotropy field component.

2. A sensor as claimed in claim 1, characterized in that the sublayer of metal is cobalt.

3. A sensor as claimed in claim 2, characterized in that the F2 multilayer structure is a Co/Pd multilayer.

* * * * *